(12) United States Patent
Ma et al.

(10) Patent No.: US 11,340,274 B2
(45) Date of Patent: May 24, 2022

(54) METHOD AND DEVICE FOR LOCATING EQUIPMENT-LEVEL OSCILLATION SOURCES OF DFIG GRID-CONNECTED SYSTEM

(71) Applicant: NORTH CHINA ELECTRIC POWER UNIVERSITY, Beijing (CN)

(72) Inventors: Jing Ma, Beijing (CN); Min Zhang, Beijing (CN); Yi Zhou, Beijing (CN); Zhenmiao Yang, Beijing (CN)

( * ) Notice: Subject to any disclaimer, the term of this patent is extended or adjusted under 35 U.S.C. 154(b) by 0 days.

(21) Appl. No.: 16/937,662

(22) Filed: Jul. 24, 2020

(65) Prior Publication Data
US 2021/0033650 A1 Feb. 4, 2021

(30) Foreign Application Priority Data
Jul. 30, 2019 (CN) .......................... 201910705173.6

(51) Int. Cl.
*G01R 21/133* (2006.01)
*G06N 5/02* (2006.01)
*H02P 9/00* (2006.01)

(52) U.S. Cl.
CPC ............. *G01R 21/133* (2013.01); *G06N 5/02* (2013.01); *H02P 9/007* (2013.01)

(58) Field of Classification Search
CPC .......... G01R 21/133; G06N 5/02; H02P 9/007
See application file for complete search history.

(56) References Cited

U.S. PATENT DOCUMENTS

2020/0224877 A1*  7/2020  Gomez Del Campo . F02C 7/22
2021/0036518 A1*  2/2021  Ma ........................... H03L 7/18

FOREIGN PATENT DOCUMENTS

| CN | 109193752 A | * | 1/2019 | |
|---|---|---|---|---|
| CN | 109193752 A | | 1/2019 | |
| CN | 110011357 A | * | 7/2019 | |
| CN | 110011357 A | | 7/2019 | |
| CN | 110417056 A | * | 11/2019 | ........... G01R 21/133 |

OTHER PUBLICATIONS

CN-110417056-A_Translated, Zhou Xiaodong (Year: 2019).*
CN-110011357-A, Jiang Ping (Year: 2019).*
CN-109193752-A, Wu Shengjin (Year: 2019).*
(Continued)

*Primary Examiner* — Natalie Huls
*Assistant Examiner* — Michael J Singletary
(74) *Attorney, Agent, or Firm* — Analects Legal LLC

(57) ABSTRACT

The application relates to a method and device for locating equipment-level oscillation sources of DFIG grid-connected system, which belongs to the technical field of wind generation, and solves the problem of stable operation of the wind power grid-connected system at the current stage. The method comprises: constructing the energy correlation topology network of the components in DFIG; analyzing the dynamic energy flows between the components during the oscillation process; calculating magnitudes of the causality between the dynamic energy flows; building a causality diagram of oscillation transmission in the DFIG; analyzing the distribution of the magnitude of the causality in the diagram, determining the oscillation transmission routes and locating the oscillation sources.

7 Claims, 9 Drawing Sheets

(56) References Cited

OTHER PUBLICATIONS

Wang, Y.; Yuan, Y. Inertia Provision and Small Signal Stability Analysis of a Wind-Power Generation System Using Phase-Locked Synchronized Equation. Sustainability 2019, 11, 1400. https://doi.org/10.3390/su11051400) (Year: 2019).*

English Translation of Office Action issued in Chinese patent application No. 201910705173.6 dated Jul. 28, 2020.

English Translation of Research on Plant-level Oscillation Roots Location of Based on PDC, Weiwei LUO, East China University of Science and Technology, C029-91, dated Jan. 15, 2012.

T. K. Chau, et al., "A Novel Control Strategy of DFIG Wind Turbines in Complex Power Systems for Enhancement of Primary Frequency Response and LFOD,"IEEE Trans. Power Syst., vol. 33, No. 2, pp. 1811-1823, Mar. 2018.

A. K. Gupta, et al., "Dynamic impact analysis of DFIG-based wind turbine generators on low-frequency oscillations in power system,"IET Gener. Transm. Distrib.,vol. 11, No. 18, pp. 4500-4510, Jun. 2017.

B. Wang and K. Sun, "Location methods of oscillation sources in power systems: A survey,"Journal of Modern Power Systems and Clean Energy, vol. 5, pp. 151-159, Mar. 2017.

J. Ma, et al., "Application of Phasor Measurement Unit on Locating Disturbance Source for Low-Frequency Oscillation," IEEE Trans. Smart Grid, vol. 1, No. 3, pp. 340-346, Dec. 2010.

H. Wu, et al., "Disturbance Source Self-Diagnosis of the Smart Grid,"Spring Congress on Engineering and Technology, Xian, 2012, pp. 1-4.

J. S. Thorp, et al., "Electromechanical wave propagation in large electric power systems,"IEEE Trans. Circuits Syst I: Fundam Theory and Appl, vol. 45, No. 6, pp. 614-622, Jun. 1998.

P. N. Markham and Y. L. Liu, "Electromechanical speed map development using FNET/GridEye frequency measurements," IEEE PES General Meeting | Conference & Exposition, National Harbor, MD, 2014, pp. 1-5.

A. J. Arana, et al., "Estimating speed of frequency disturbance propagation through transmission and distribution systems," IEEE PES Power Systems Conference and Exposition, Atlanta, GA, 2006, pp. 1286-1290.

Y. B. Shu, et al., "Analysis of low frequency oscillation and source location in power systems," CSEE Journal of Power and Energy Systems, vol. 4, No. 1, pp. 58-66, Mar. 2018.

L. Chen, et al., "An energy-based method for location of power system oscillation source," IEEE Trans. Power Syst., vol. 28, No. 2, pp. 828-836, May 2013.

L. Chen, et al., "Transient energy dissipation of resistances and its effect on power system damping," Int. J. Electr. Power Energy Syst., vol. 91, pp. 201-208,Oct. 2017.

S. Maslennikov, et al., "Dissipating energy flow method for locating the source of sustained oscillations," Int. J. Elect.Power Energy Syst., vol. 88, pp. 55-62, Jun. 2017.

F.Tang, et al., "Research on forced oscillations disturbance source locating through an energy approach," Int. Trans. Electr. Energ. Syst., vol. 26, pp. 192-207,Apr. 2015.

J. Mohammadi, et al., "A combined vector and direct power control for DFIG-Based wind turbines," IEEE Trans. Sustain. Energy, vol. 5, No. 3, pp. 767-775, Jul. 2014.

S. H. Li, et al., "Control of DFIG wind turbine with direct-current cector control configuration,"IEEE Trans. Sustain. Energy, vol. 3, No. 1, pp. 1-11, Jan. 2012.

Y. H. Moon, et al., "Energy conservation law and its application for the direct energy method of power system stability," IEEE PES Winter Meeting, New York, NY, 1999, pp. 695-700 vol. 1.

Y. Li, et al.,"An energy-based methodology for locating the source of forced oscillations in power systems,"IEEE International Conference on Power System Technology, Auckland, 2012, pp. 1-6.

L. A. Baccalá and K. Sameshima, "Partial directed coherence: a new concept in neural structure determination," Biological Cybernetics, vol. 84, No. 6, pp. 463-474, May 2001.

* cited by examiner

METHOD AND DEVICE FOR LOCATING EQUIPMENT-LEVEL OSCILLATION SOURCES OF DFIG GRID-CONNECTED SYSTEM

CROSS-REFERENCE TO RELATED APPLICATIONS

This application claims priority to Chinese Patent Application No. 201910705173.6, filed on Jul. 30, 2019, which is hereby incorporated by reference in its entirety.

TECHNICAL FIELD

The present application relates to the technical field of wind generation, and particularly relates to a method and device for locating equipment-level oscillation sources of DFIG (Doubly Fed Induction Generator) grid-connected system.

BACKGROUND

With wind generator integrated to power grid in ever large scale with high permeability, the dynamic characteristics of power system have undergone great changes, and posing potential threat to the safe operation of system. Low frequency oscillation is one of the main bottlenecks that constrain the integration of wind generation. Locating timely, accurately and adjusting quickly the equipment that triggers oscillation, as well as its components and control links, it is very important for suppressing oscillation diffusion and ensuring the stable operation of the system. Therefore, it is imperative to study the method for positioning equipment-level oscillation sources of wind power grid-connected units.

Concerning the problem of localization of low frequency oscillation sources, scholars have conducted related research. The methods mainly include three categories: hybrid simulation method, waveform similarity method and energy function method. Hybrid simulation method is an early-stage method used to locate the oscillation sources by comparing the real-time phasor measurement data of synchronous phasor measurement unit with software simulation data. Waveform similarity method locates the oscillation sources mainly according to the similarity and time-delay of the transmission of special form of voltage traveling wave to different nodes in the power grid during oscillation. Energy function method proceeds from the transient energy function and locates the oscillation sources by analyzing the variation characteristic of energy during the oscillation process. The above methods can identify the generator or region where the oscillation source is located accurately. However, in real system, in order to realize fast suppression of oscillation, it is necessary to further determine the specific components inside the unit where the oscillation source is located. Due to the complex correlation between the components of the DFIG, existing methods fail to give a conduction path for oscillation inside DFIG.

SUMMARY

In view of the above analysis, the application aims to propose a method and device for locating equipment-level oscillation sources of DFIG grid-connected system. It is used to solve the problem of stable operation of the wind power grid-connected system at the current stage.

The purpose of the present application is mainly achieved by the following technical solutions.

The application proposes a method for locating equipment-level oscillation sources of DFIG grid-connected system, including, step S1: constructing the energy correlation topology network of the components in DFIG;

step S2: analyzing the dynamic energy flows between the components during the oscillation process; and step S3: calculating magnitudes of the causality between the dynamic energy flows; building a causality diagram of oscillation transmission in the DFIG; analyzing the distribution of the magnitude of the causality in the diagram, determining the oscillation transmission routes and locating the oscillation sources.

Further, wherein the step S3 includes, step S301: normalizing the dynamic energy flows;

step S302: through vector autoregressive model, performing partial directional coherence analysis on the normalized dynamic energy flows, obtaining a matrix of magnitudes of the causality between the dynamic energy flows;

step S303: combining the magnitude of the causality with the dynamic energy correlation topology network of the wind turbine, building the causality diagram of oscillation transmission; and step S304: depicting the oscillation transmission routes in the causality diagram of oscillation transmission according to the size order of the magnitudes of the causality in the diagram, and locating the equipment-level oscillation sources according to the determined oscillation transmission routes.

Further, the vector autoregressive model is $$\begin{bmatrix} x_1(t) \\ \vdots \\ x_m(t) \end{bmatrix} = \sum_{r=1}^{p} A_r \begin{bmatrix} x_1(t-r) \\ \vdots \\ x_m(t-r) \end{bmatrix} + \begin{bmatrix} u_1(t) \\ \vdots \\ u_m(t) \end{bmatrix};$$

where $(x_1(t), \ldots, x_m(t))^T$ is the dynamic energy flows between m components at t; $(x_1(t-r), \ldots, x_m(t-r))^T$ is the dynamic energy flows between m components at t−r; $r \in 1, 2, \ldots, p$, p is the order of the vector autoregressive model; $(u_1(t), \ldots, u_m(t))^T$ is the an error vector uncorrelated with the dynamic energy flows at t; $A_r$ is the matrix of magnitudes of the causality to be estimated, with its element $A_r(ij)$, $i,j=1, 2, \ldots, m$, characterizing the effect of the value $x_j(t-r)$ of the dynamic energy $x_j$ of the j-th component at t−r on the value $x_i(t)$ of the dynamic energy $x_i$ of the i-th component at t, i.e. the magnitude of the causality between the j-th component and the i-th component.

Further, wherein the components in the DFIG in step S1 include: shaft, asynchronous generator, rotor-side converter and its control, DC bus, grid-side converter and its control, power grid and PLL.

Further, wherein the dynamic energy flows between the components in the energy correlation topology network include: the dynamic energy flow output by the shaft part, the dynamic energy flow output by the DC bus part, the dynamic energy flow output by the grid-side converter and its control part, the dynamic energy flow output by the rotor-side converter and its control part, the dynamic energy flow output by the asynchronous generator and the dynamic energy flow injected into the DFIG by the power grid and the PLL.

Further, wherein during the oscillation, the dynamic energy flows $W_i$ between the components in DFIG meet the formula: $W_i = \int(P_i d\theta_i + Q_i d(\ln U_i))$; where $P_i$ and $Q_i$ respectively are the active power and reactive power of the branch to which the i-th component in the DFIG belongs; $U_i$ and $\theta_i$ respectively are the amplitude and phase angle of the voltage of the i-th component in the DFIG.

Further, wherein during the oscillation, the dynamic energy flow output by the shaft part is $W_{shaft} = \int P_t dt$; where $P_t$ is the power of wind generator;

the dynamic energy flow of the DC bus part of the DFIG is $W_{DC\ Bus} = \int (Cu_{dc}) du_{dc}$; where C is the capacitance of the DC bus; $u_{dc}$ is the voltage of the DC bus;

the dynamic energy flow of the grid-side converter and its control part is $$W_{GSC} = \int P_g d\theta_i + \int \frac{Q_g}{U_i} dU_i;$$

where $P_g$ and $Q_g$ are respectively the active power and reactive power output by the grid-side converter; $\theta_i$, $U_i$ are respectively the phase angle and amplitude of grid-side converter voltage $u_i$;

the dynamic energy flow of the rotor-side converter and its control part is $$W_{RSC} = \int P_r d\theta_r + \int \frac{Q_r}{U_r} dU_r;$$

where $P_r$ and $Q_r$ are respectively the active power and reactive power output by the rotor-side converter; $\theta_r$ and $U_r$ are respectively the phase angle and amplitude of rotor voltage $u_r$;

the dynamic energy flow of the asynchronous generator in the DFIG is $$W_{AG} = \int P_s d\theta_s + \int \frac{Q_s}{U_s} dU_s;$$

where $P_s$ and $Q_s$ are respectively the active power and reactive power output by stator side; $\theta_s$ and $U_s$ are respectively the phase angle and amplitude of asynchronous generator voltage $u_s$; and the dynamic energy flow injected into the DFIG by the power grid and the PLL is $$W_{grid} = \int Pd\theta_g + \int \frac{Q}{U_g} dU_g;$$

where P and Q are respectively the active power and reactive power of power grid; $\theta_g$ and $U_g$ are respectively the phase angle and amplitude of power grid voltage $u_g$.

The application proposes a device for locating equipment-level oscillation sources of DFIG grid-connected system, including a data collecting module, a DFIG dynamic energy flows analyzing module and an equipment-level oscillation sources locating module;

the data collecting module is used to collect the parameters, operation data of components in DFIG of the wind power grid-connected system and operation data of each node of system, and to send the collected data to the DFIG dynamic energy flows analyzing module and the equipment-level oscillation sources locating module;

the DFIG dynamic energy flows analyzing module is used to construct the energy correlation topology network of the components in DFIG, and to analyze the dynamic energy flows between the components during the oscillation process;

the equipment-level oscillation sources locating module is used to calculate magnitudes of the causality between the dynamic energy flows, to build a causality diagram of oscillation transmission in the DFIG, and to analyze the distribution of the magnitude of the causality in the diagram, and to determine the oscillation transmission routes and to locate the oscillation sources.

Further, wherein the equipment-level oscillation sources locating module includes a normalization module, a vector autoregressive model, a causality diagram construction module and an oscillation sources localization module;

The normalization module is used to normalize the dynamic energy flows;

the vector autoregressive model is used to performing partial directional coherence analysis on the normalized dynamic energy flows and obtain a matrix of magnitudes of the causality between the dynamic energy flows;

the causality diagram construction module is used to combine the magnitude matrix of the causality with the dynamic energy correlation topology network of the wind turbine and build the causality diagram of oscillation transmission;

the oscillation sources localization module is used to depict the oscillation transmission routes in the causality diagram of oscillation transmission according to the size order of the magnitudes of the causality in the diagram, and to locate the equipment-level oscillation sources according to the determined oscillation transmission routes.

Further, the vector autoregressive model is $$\begin{bmatrix} x_1(t) \\ \vdots \\ x_m(t) \end{bmatrix} = \sum_{r=1}^{p} A_r \begin{bmatrix} x_1(t-r) \\ \vdots \\ x_m(t-r) \end{bmatrix} + \begin{bmatrix} u_1(t) \\ \vdots \\ u_m(t) \end{bmatrix};$$

where $(x_1(t), \ldots, x_m(t))^T$ is the dynamic energy flows between m components at t; $(x_1(t-r), \ldots, x_m(t-r))^T$ is the dynamic energy flows between m components at t−r; r E 1, 2, ..., p, p is the order of the vector autoregressive model; $(u_1(t), \ldots, u_m(t))^T$ is the an error vector uncorrelated with the dynamic energy flows at t; $A_r$ is the matrix of magnitudes of the causality to be estimated, with its element $A_r(ij)$, i,j=1, 2, ..., m, characterizing the effect of the value $x_j(t-r)$ of the dynamic energy $x_j$ of the j-th component at t−r on the value $x_i(t)$ of the dynamic energy $x_i$ of the i-th component at t.

The application proposes a non-transitory machine-readable storage medium comprising instructions that when executed cause a processor of a computing device to: construct energy correlation topology network of components in DFIG; analyze dynamic energy flows between the components during oscillation process; and calculate magnitudes of causality between the dynamic energy flows; building a causality diagram of oscillation transmission in the DFIG; analyzing distribution of the magnitude of the causality in the diagram, determining oscillation transmission routes and locating the oscillation sources.

The beneficial effects of the present application are as follows:

The application can quantitatively describe the intensity of interaction between the dynamic energy flows of the DFIG internal components and accurately identify the equipment-level the oscillation sources and oscillation transmission routes.

BRIEF DESCRIPTION OF DRAWINGS

The attached figures are only for the purpose of illustrating specific embodiments, and are not considered to limit the present application. In the whole figures, the same reference symbols indicate the same components.

DESCRIPTION OF EMBODIMENTS

The preferred embodiments of the application will be described below in combination with the attached figures in detail, where the attached figures form part of the application and, together with the embodiments of the application, are used to explain the principles of the application, not to define the scope of the application.

The First Embodiment

Figure 1:
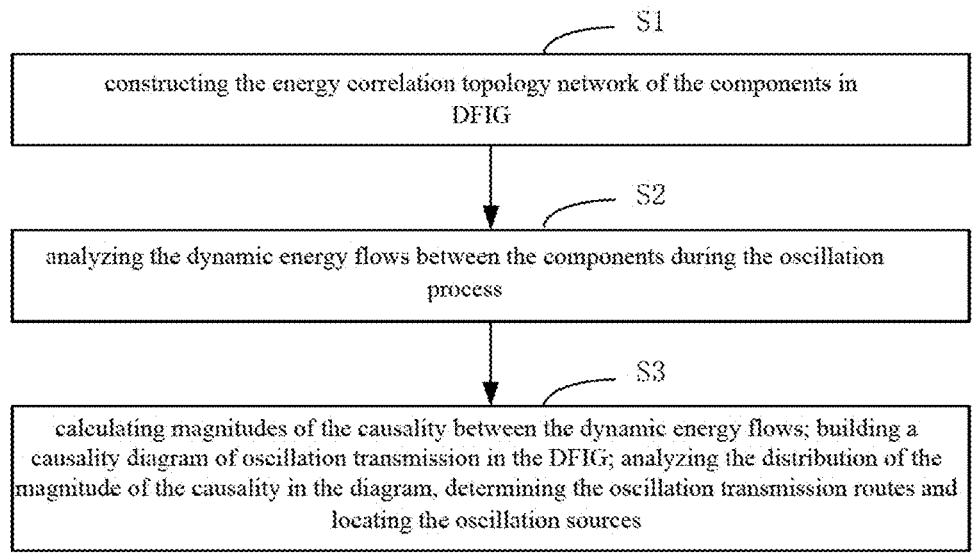
FIG. 1 is a flow chart of a method of locating equipment-level oscillation sources in the first embodiment of the present application.
Figure 2:
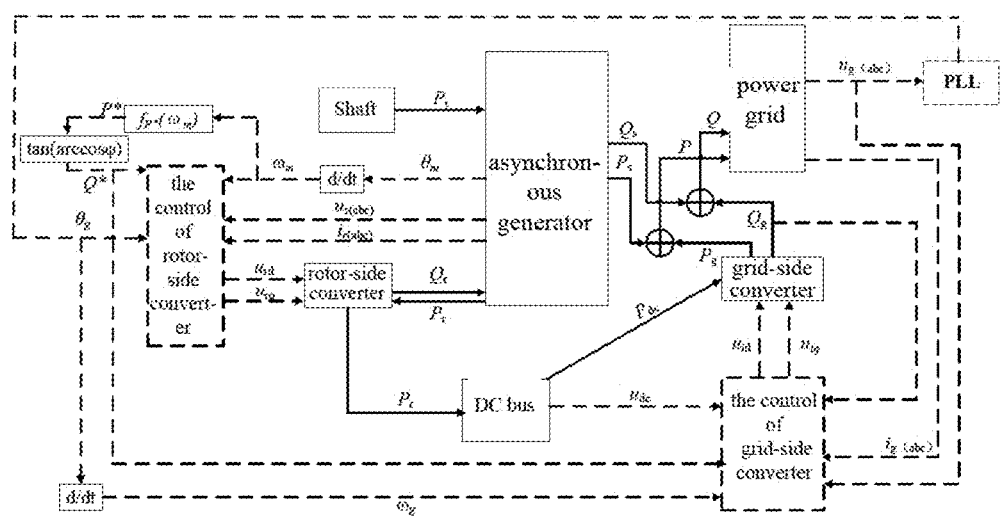
FIG. 2 is a block diagram of the detailed model of DFIG in the first embodiment of the present application.
Figure 3:
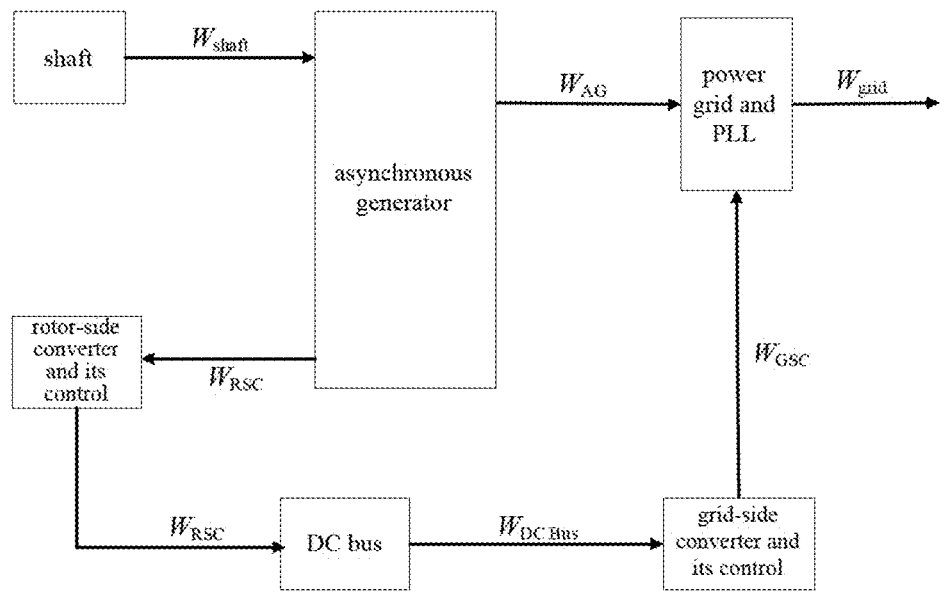
FIG. 3 is a diagram of the dynamic energy correlation topology network in the first embodiment of the present application.

This embodiment proposes a method for locating equipment-level oscillation sources of DFIG grid-connected system, as shown in FIG. 1, which includes the following steps:

step S1: constructing the energy correlation topology network of the components in DFIG;

according to the detailed model of DFIG as shown in FIG. 2, DFIG can be divided into six components, i.e. the shaft, asynchronous generator, rotor-side converter (RSC) and its control, DC bus, grid-side converter (GSC) and its control, power grid and PLL, etc;

constructing the dynamic energy correlation topology network of the components in DFIG as shown in FIG. 3, wherein the dynamic energy flows 14;

between the components include: the dynamic energy flow $W_{shaft}$ output by the shaft part, the dynamic energy flow $W_{DC\,Bus}$ output by the DC bus part, the dynamic energy flow $W_{GSC}$ output by the grid-side converter and its control part, the dynamic energy flow $W_{RSC}$ output by the rotor-side converter and its control part, the dynamic energy flow $W_{AG}$ output by the asynchronous generator and the dynamic energy flow injected into the DFIG by the power grid and the PLL $W_{grid}$.

During the oscillation, the dynamic energy flows $W_i$ between the components in the DFIG meet the formula:

$$W_i = \int \left( P_i d\theta_i + \frac{Q_i}{U_i} dU_i \right) = \int (P_i d\theta_i + Q_i d(\ln U_i));$$

where $P_i$ and $Q_i$ respectively are the active power and reactive power of the branch to which the i-th component in the DFIG belongs; $U_i$ and $\theta_i$ respectively are the amplitude and phase angle of the voltage of the i-th component in the DFIG. Considering that oscillation belongs to the dynamic process of the system, the dynamic energy flows can be obtained by removing the steady-state value during normal operation included in the formula.

Step S2: analyzing the dynamic energy flows of the components in the energy correlation topology network during the oscillation process;

Specifically, according to the formula satisfied by the above dynamic energy flows $W_i$, each dynamic energy flows is analyzed:

(1) The dynamic energy flow output by the shaft part during the oscillation process is:

$$W_{shaft} = \int P_t dt;$$

where $P_t$ is the power of wind generator.

(2) The dynamic energy flow of the DC bus part of the DFIG during the oscillation process is:

$$W_{DC\,Bus} = \int P_{dc} dt = \int \left( Cu_{dc} \frac{du_{dc}}{dt} \right) dt = \int (Cu_{dc}) du_{dc}$$

where C is the capacitance of the DC bus; $u_{dc}$ is the voltage of the DC bus; $P_{dc}$ is the power of the DC bus.

(3) The dynamic energy flows of the grid-side converter of the DFIG and its control part during the oscillation process are:

$$W_{GSC} = \int P_g d\theta_i + \int \frac{Q}{U_i} dU_i = \int \left\{ \left| \frac{1.5 U_g}{-\omega_g L_T} \right| \left( u_{iq} + \left( \begin{array}{l} k_{ip\_g}\left(-\frac{Q^*}{1.5 E_m} - 1.5\omega_g C_f U_g - i_{iq}\right) + \\ k_{u\_g} \int \left(-\frac{Q^*}{1.5 E_m} - 1.5\omega_g C_f U_g - i_{iq}\right) dt \end{array} \right) \right) \right\} d\theta_i +$$

$$\int \left[ \left| \frac{-1.5 U_g}{\omega_g L_T} \right| \left( \begin{array}{l} u_{id} - E_m + \\ \left( \begin{array}{l} k_{ip\_g}(k_{Vp\_g}(u_{dc}^* - u_{dc}) + \\ k_{vi\_g} \int (u_{dc}^* - u_{dc}) dt + \\ \frac{1}{\omega_g L_T} \left( \begin{array}{l} u_{iq} - k_{ip\_g}\left(\frac{Q^*}{1.5 E_m} + \\ 1.5\omega_g C_f U_g + i_{iq}\right) \\ k_{u\_g} \int \left(\frac{Q^*}{1.5 E_m} + \\ 1.5\omega_g C_f U_g + i_{iq}\right) dt \end{array} \right) \end{array} \right) + \\ k_{u\_g} \int \left( \begin{array}{l} k_{vp\_g}(u_{dc}^* - u_{dc}) + k_{vi\_g} \int (u_{dc}^* - u_{dc}) dt + \\ \frac{1}{\omega_g L_T} \left( \begin{array}{l} u_{iq} - k_{ip\_q} - \frac{Q^*}{1.5 E_m} + \\ 1.5\omega_g C_f U_g + i_{iq} - \\ k_{u\_g} \int \left(\frac{Q^*}{1.5 E_m} + \\ 1.5\omega_g C_f U_g + i_{iq}\right) dt \end{array} \right) \end{array} \right) dt \end{array} \right] d\ln U_i$$

where $P_g$ and $Q_g$ are respectively the active power and reactive power output by the grid-side converter; $u_{id}$ and $u_{iq}$ are respectively the d-axis and q-axis voltage components of the grid-side converter; $k_{ip\_g}$ and $k_{ii\_g}$ are respectively the proportion coefficient and integration coefficient of current inner-loop simulated PI regulator of the grid-side converter; $\omega_g$ is the synchronous electrical angular speed of the power grid; $L_T$ is the equivalent inductance of the reactor on the inlet line of the grid-side converter; $i_{id}$ and $i_{iq}$ can be calculated according to the grid-side current $i_g$ and the phase angle of the grid voltage $\theta_g$; $k_{vp\_g}$ and $k_{vi\_g}$ are respectively the proportion coefficient and integration coefficient of voltage outer-loop simulated PI regulator; $u_{dc}$ is the voltage of the DC bus; $u_{dc}^*$ is the reference value of the DC bus voltage; $Q^*$ is the reference value of reactive power; $E_m$ is the voltage vector of the grid; $C_f$ is the capacitance of filter; $U_g$ is the amplitude of the grid voltage; $\theta_i$, $U_i$ are respectively the phase angle and amplitude of the grid-side converter voltage $u_i$.

(4) The dynamic energy flow of the rotor-side converter of the DFIG and its control part during the oscillation process is:

$$W_{RSC} = \int P_r d\theta_r + \int \frac{Q_r}{U_r} dU_r =$$

$$\int \left\{ \left| \frac{1.5 U_g}{-\omega_g L_T} \right| \left( \begin{array}{l} u_{iq} + C u_{dc} \frac{du_{dc}}{dt} - \\ \left( \begin{array}{l} k_{ip\_g}\left(\frac{Q^*}{1.5 E_m} + 1.5\omega_g C_f U_g + i_{iq}\right) \\ k_{ii\_q} \int \left(\frac{Q^*}{1.5 E_m} + 1.5\omega_g C_f U_g + i_{iq}\right) dt \end{array} \right) \end{array} \right) \right\} d\theta_r +$$

$$\int Q_r d\ln U_r$$

where $P_r$ and $Q_r$ are respectively the active power and reactive power output by the rotor-side converter; $\theta_r$ and $U_r$ are respectively the phase angle and amplitude of the rotor voltage $u_r$; C is the capacitance of the DC bus; $u_{dc}$ is the voltage of the DC bus; $U_g$ is the amplitude of the grid voltage; $\omega_g$ is the synchronous electrical angular speed of the power grid; $L_T$ is the equivalent inductance of the reactor on the inlet line of the grid-side converter; $Q^*$ is the reference value of reactive power; $E_m$ is the voltage vector of the power grid; $C_f$ is the capacitance of filter; $u_{iq}$ is respectively the q-axis voltage component of the grid-side converter; $i_{iq}$ can be calculated according to the grid-side current $i_g$ and the phase angle of the power grid voltage $\theta_g$; $k_{ip\_g}$ and $k_{ii\_g}$ are respectively the proportion coefficient and integration coefficient of current inner-loop simulated PI regulator of the grid-side converter.

(5) The dynamic energy flow of the asynchronous generator part in the DFIG during the oscillation process is:

$$W_{AG} = \int P_s d\theta_s + \int \frac{Q_s}{U_s} dU_s =$$

$$\int \left(\frac{3}{2}\frac{L_m}{L_s} u_{sq} i_{rg}\right) d\theta_s + \int \left\{ \frac{1}{\omega_s \sigma L_r} \left( \begin{array}{l} \frac{3}{2}\frac{L_m}{L_s} u_{sq}(i_{ms} - \\ u_{rq} - \\ \left(k_{ip\_r} + \frac{k_{ii\_r}}{s}\right)(i_{rq}^* - i_{rq}) - \\ \sigma L_r \frac{di_{rq}}{dt} - \frac{\omega_s L_m^2 i_{ms}}{L_s} \end{array} \right) \right\} d\ln U_s$$

where $P_s$ and $Q_s$ are respectively the active power and reactive power output by stator side; $U_s$ and $\theta_s$ are respectively the amplitude and phase angle of the stator side port of the asynchronous generator voltage $u_s$; $u_{sq}$ is the q-axis component of the stator voltage; $k_{ip\_r}$ and $k_{ii\_r}$ are respectively the proportion coefficient and integration coefficient of the rotor-side converter current inner-loop PI regulator; s is slip rate; $u_{rq}$ and $i_{rq}$ are respectively the q-axis components of the rotor voltage and current, which can be calculated according to the stator voltage $u_{r\,(abc)}$, the phase angle of the power grid voltage $\theta_g$ and the rotor current $i_{r\,(abc)}$; $\omega_s$ is the angular speed of doubly-fed asynchronous generator stator; $i_{ms}$ is the mutual inductance current of the double-fed asynchronous generator stator; $\sigma$ is the coefficient of leakage magnetic field; $L_s$, $L_r$ and $L_m$ are respectively the stator inductance, rotor inductance and the mutual inductance between the stator and the rotor;

$$\frac{\omega_s L_m^2 i_{ms}}{L_s}$$

is the disturbance item generated by the counter emf (that is, counter electromotive force) of DFIG; $i_{rq}^*$ is the q-axis reference values of the rotor current, the former is calculated according to the reactive power reference value $Q^*$, the latter is given by the motor speed outer loop control combined with the rotor speed $\omega_m$ (which can be calculated according to rotor angle $\theta_m$).

(6) The dynamic energy flow injected into the DFIG by the power grid and the PLL during the oscillation process is:

$$W_{gnd} =$$

$$\int P d\theta_g + \int \frac{Q}{U_g} dU_g = \int \left\{ \begin{array}{l} \frac{3}{2}\frac{L_m}{L_s} u_{sq} i_{rq} \\ \frac{1.5 U_g}{\omega_g L_T}\left(u_{iq} + \left(\begin{array}{l} k_{ip\_g}\left(-\frac{Q^*}{1.5 E_m} - 1.5\omega_g C_f U_g - i_{iq}\right) + \\ k_{ii\_g}\left(-\frac{Q^*}{1.5 E_m} - 1.5\omega_g C_f U_g - i_{iq}\right)dt \end{array}\right)\right) \end{array} \right\} d\theta_g +$$

$$\int \left\{ \begin{array}{l} \frac{3}{2}\frac{L_m}{L_s} u_{sq}\left(i_{ms} - \left(\frac{1}{\omega_s \sigma L_r}\left(\begin{array}{l} u_{rq} - \left(k_{ip\_r} + \frac{k_{u\_r}}{s}\right)(i_{rq}^* - i_{rq}) - \\ \sigma L_r \frac{di_{rq}}{dt} - \frac{\omega_s \sigma L_m^2 i_{ms}}{L_s} \end{array}\right)\right)\right) - \\ \frac{1.5 U_g}{\omega_g L_T}\left(\begin{array}{l} u_{id} - E_m + \\ k_{ip\_g}\left(\begin{array}{l} k_{vp\_g}(u_{dc}^* - u_{dc}) + \\ k_{vi\_g}\int(u_{dc}^* - u_{dc})dt + \\ \frac{1}{\omega_g L_T}\left(u_{iq} - \left(\begin{array}{l} k_{ip\_g}\left(\frac{Q^*}{1.5 E_m} + \\ 1.5\omega_g C_f U_g + i_{iq}\right) \\ k_{u\_g}\int\left(\frac{Q^*}{1.5 E_m} + \\ 1.5\omega_g C_f U_g + i_{iq}\right)dt \end{array}\right)\right) \end{array}\right) \\ k_{u\_g}\int\left(\begin{array}{l} k_{vp\_g}(u_{dc}^* - u_{dc}) + k_{vi\_g}\int(u_{dc}^* - u_{dc})dt + \\ \frac{1}{\omega_g L_T}\left(\begin{array}{l} u_{iq} - \\ \left(\begin{array}{l} k_{ip\_q}\left(\frac{Q^*}{1.5 E_m} + \\ 1.5\omega_g C_f U_g + i_{iq}\right) \\ k_{u\_q}\int\left(\frac{Q^*}{1.5 E_m} + \\ 1.5\omega_g C_f U_g + i_{iq}\right)dt \end{array}\right) \end{array}\right)dt \end{array}\right) \end{array} \right\} d\ln U_g$$

where $W_{grid}$ is the dynamic energy flow injected into the DFIG by the power grid and the PLL; $\theta_r$ and $U_r$ are respectively the phase angle and amplitude of rotor voltage $u_r$; $\theta_i$ and $U_i$ are respectively the phase angle and amplitude of the grid-side converter voltage $u_i$.

Step S3: calculating magnitudes of the causality between the dynamic energy flows; building a causality diagram of oscillation transmission in the DFIG; analyzing the distribution of the magnitude of the causality in the diagram, determining the oscillation transmission routes and locating the oscillation sources.

Specifically, step S3 includes the following sub-steps:

step S301: normalizing the dynamic energy flows;

for the time series of the dynamic energy flows $\{x_i\}$, the normalization formula is:

$$x_i = \frac{|x_i - \bar{x}|}{\left(\frac{1}{n}\sum_{i=1}^{n}(x_i - \bar{x})^2\right)^{\frac{1}{2}}}$$

where n is the length of the time series; $\bar{x}$ is the mean value of $\{x_i(k)\}$.

Step S302: through vector autoregressive model, performing partial directional coherence (PDC) analysis on the normalized dynamic energy flows, obtaining a matrix of magnitudes of the causality between the dynamic energy flows;

the vector autoregressive model is:

$$\begin{bmatrix} x_1(t) \\ \vdots \\ x_m(t) \end{bmatrix} = \sum_{r=1}^{p} A_r \begin{bmatrix} x_1(t-r) \\ \vdots \\ x_m(t-r) \end{bmatrix} + \begin{bmatrix} u_1(t) \\ \vdots \\ u_m(t) \end{bmatrix}$$

where $A_r$ is coefficient matrix of the causality to be estimated, which is a m-dimensional square, its element $A_r(ij)$ characterizes the effect of the value $x_j(t-r)$ of the dynamic energy of the j-th component $x_j$ at $t-r$ on the value $x_i(t)$ of the dynamic energy of the i-th component $x_i$ at t, in the present embodiment, m=6. For any $r \in 1, 2, \ldots, p$, $A_r(ij)$ is significantly non-zero, then it can be considered that $x_j$ and $x_i$ are causally related. p is the order of the vector autoregressive model; $(u_1(t), \ldots, u_m(t))^T$ is the error vector uncorrelated with the dynamic energy flows.

Step S303: combining the magnitude of the causality with the dynamic energy correlation topology network of the wind turbine, building the causality diagram of oscillation transmission;

the matrix of magnitudes of the causality between the dynamic energy flows of the components during the oscillation can be obtained through the vector auto-regression model, which can quantitatively characterize the transmission direction and interaction intensity of oscillation between components of the DFIG. Then the corresponding causality value is marked at the corresponding position in the dynamic energy correlation topology network, and the causality diagram of oscillation transmission is constructed;

The directional lines are used to demonstrate the oscillation transmission direction in the diagram, the starting point is connected to the part corresponding to the 'cause' dynamic energy flow, and the ending point is connected to the part corresponding to the 'result' dynamic energy flow.

Step S304: according to the characteristics that the oscillation gradually decays from the source to the outside, depicting the oscillation transmission routes in the causality diagram of the oscillation transmission according to the size order of the magnitudes of the causality in the diagram, and locating the equipment-level oscillation sources according to the determined oscillation transmission routes.

The Second Embodiment

Figure 4:
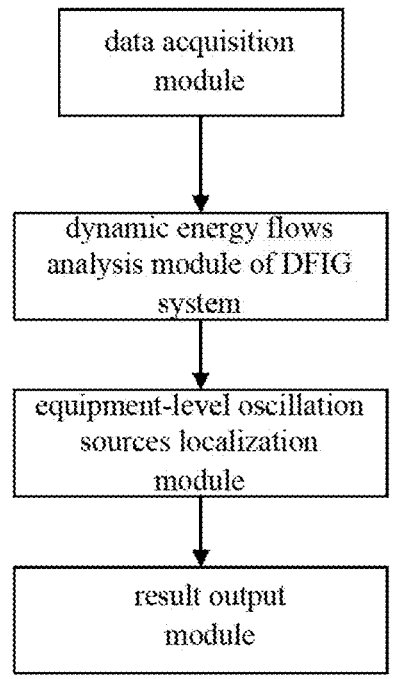
FIG. 4 is a schematic diagram of a system of locating equipment-level oscillation sources in the second embodiment of the present application.

This embodiment proposes a device for locating equipment-level oscillation sources of DFIG grid-connected system as shown in FIG. 4, which includes a data collecting module, a DFIG dynamic energy flows analyzing module, an equipment-level oscillation sources locating module and a third processor.

The data collecting module is used to collect the parameters, operation data of components in DFIG of the wind power grid-connected system and operation data of each node of system, and to send the collected data to the DFIG dynamic energy flows analyzing module and the equipment-level oscillation sources locating module.

The DFIG dynamic energy flows analyzing module is used to construct the energy correlation topology network of the components in DFIG, and to analyze the dynamic energy flows between the components during the oscillation process.

The equipment-level oscillation sources locating module is used to calculate magnitudes of the causality between the dynamic energy flows; to build a causality diagram of oscillation transmission in the DFIG, and to analyze the distribution of the magnitude of the causality in the diagram, and to determine the oscillation transmission routes and to locate the oscillation sources.

The third processor is used to output the located equipment-level oscillation sources of DFIG grid-connected system.

The equipment-level oscillation sources locating module calculates the magnitudes of the causality between the dynamic energy flows of components through partial directional coherence (PDC) analysis according to the information sent by the data collecting module and the dynamic energy of each component of the system determined by the DFIG dynamic energy flows analyzing module, and then the causality diagram of oscillation transmission in the DFIG is depicted, thereby determining the oscillation transmission routes and locating the oscillation sources.

Further, the equipment-level oscillation sources locating module includes a normalization module, a vector autoregressive model, a causality diagram construction module and an oscillation sources localization module.

The normalization module is used to normalize the dynamic energy flows.

The vector autoregressive model is used to performing partial directional coherence analysis on the normalized dynamic energy flows and obtain a matrix of magnitudes of the causality between the dynamic energy flows.

The causality diagram construction module is used to combine the magnitude matrix of the causality with the dynamic energy correlation topology network of the wind turbine and build the causality diagram of oscillation transmission;

The oscillation sources localization module is used to depict the oscillation transmission routes according to the size order of the magnitudes of the causality in the diagram, and to locate the equipment-level oscillation sources according to the determined oscillation transmission routes.

Further, the vector autoregressive model is $$\begin{bmatrix} x_1(t) \\ \vdots \\ x_m(t) \end{bmatrix} = \sum_{r=1}^{p} A_r \begin{bmatrix} x_1(t-r) \\ \vdots \\ x_m(t-r) \end{bmatrix} + \begin{bmatrix} u_1(t) \\ \vdots \\ u_m(t) \end{bmatrix};$$

where $(x_1(t), \ldots, x_m(t))^T$ is the dynamic energy flows between m components at t; $(x_1(t-r), \ldots, x_m(t-r))^T$ is the dynamic energy flows between m components at t–r; r∈1, 2, ..., p, p is the order of the vector autoregressive model processed by the vector autoregressive model; $(u_1(t), \ldots, u_m(t))^T$ is the an error vector uncorrelated with the dynamic energy flows at t; $A_r$ is the matrix of magnitudes of the causality to be estimated, wherein its element $A_r(ij)$, i,j=1, 2, ..., m, characterizing the effect of the value $x_j(t-r)$ of the dynamic energy $x_j$ of the j-th component at t–r on the value $x_i(t)$ of the dynamic energy $x_i$ of the i-th component at t.

The Third Embodiment

Figure 5:
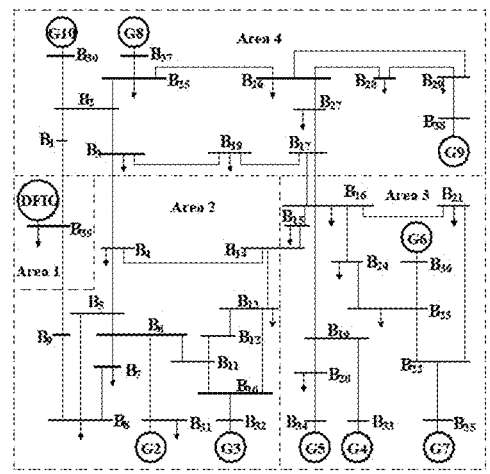
FIG. 5 is a schematic diagram of the real time digital simulation system of an IEEE 10-machine 39-bus with DFIG in the third embodiment of the present application.

The method of locating oscillation sources is verified with the Real Time Digital Simulator (RTDS) system of an IEEE 10-machine 39-bus of DFIG as shown in FIG. 5. The synchronous generators in the system apply the classic model. DFIG is integrated at Bus 39, with rated active power being 4.5 MW and reactive power being 0.2 Mvar, the main parameters are as follows: the rated voltage is 3.3 kV, the rated frequency is 60 Hz, the stator resistance is 0.003 p.u., the stator reactance is 0.125 p.u., the rotor resistance is 0.004 p.u., the rotor reactance is 0.05 p.u., the rotational inertia is 101.72 kg·m², the proportional coefficient and integral coefficient of the voltage outer loop analog PI regulator are respectively $k_{vp\_g}=8$ and $k_{vi\_g}=400$. The proportional coefficient and integral coefficient of the grid-side converter current inner loop analog PI regulator are respectively $k_{ip\_g}=0.83$ and $k_{ii\_g}=5$; the proportional coefficient and integral coefficient of the rotor-side converter current inner loop PI regulator are respectively $k_{ip\_r}=0.2$ and $k_{ii\_g}=100$.

In order to verify the correctness and effectiveness of this method, in this embodiment, under the three cases of DFIG DC bus voltage disturbance (case 1), DFIG wind turbine power disturbance (case 2), and system oscillation caused by the grid-side line fault (case 3), the variation of the dynamic energy flows of each generator and the process of locating the equipment-level oscillation sources are analyzed.

(1) Case 1: adding a continuous sinusoidal periodical voltage with a frequency of 1.27 Hz to the DC bus voltage of DFIG at t=0 s, which will trigger low frequency oscillation in the system.

Figure 6:
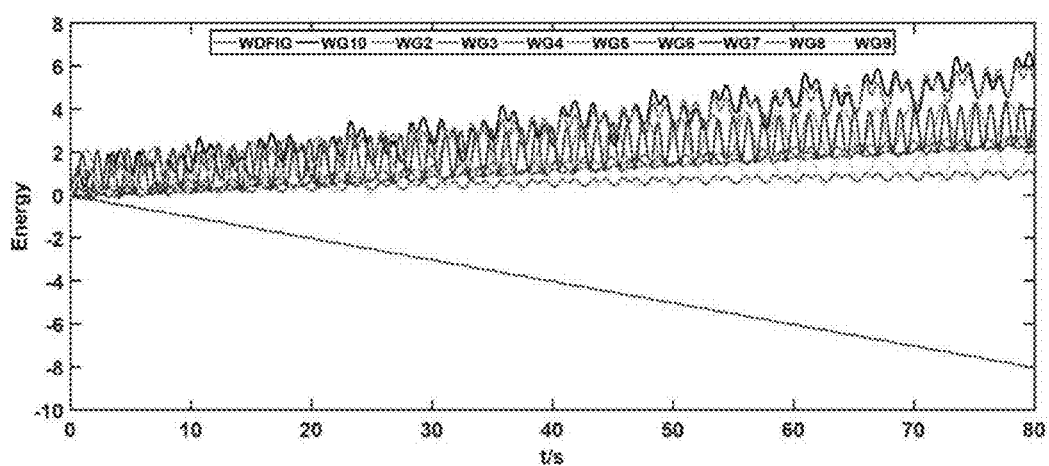
FIG. 6 is a variation diagram of the dynamic energy flows of the system into each generator in case 1 in the third embodiment of the present application.

The variation of the dynamic energy flows injected from the system to each generator can be calculated (the per-unit value is used for each variable involved in the calculation), as shown in FIG. 6. It can be seen from FIG. 6 that the dynamic energy flows injected from the power grid to the DFIG in case 1 are negative, with increasing absolute values, i.e. the DFIG keeps injecting the dynamic energy to the power grid. At 80 s, the dynamic energy injected by DFIG reaches 8(p.u.) in case 1, while the other nine generators, i.e. G2, G3, G4, G5, G6, G7, G8, G9 and G10 keep absorbing the dynamic energy from the power grid. According to the above characteristics, it can be identified that the oscillation sources exists in the DFIG in case 1.

Figure 7:
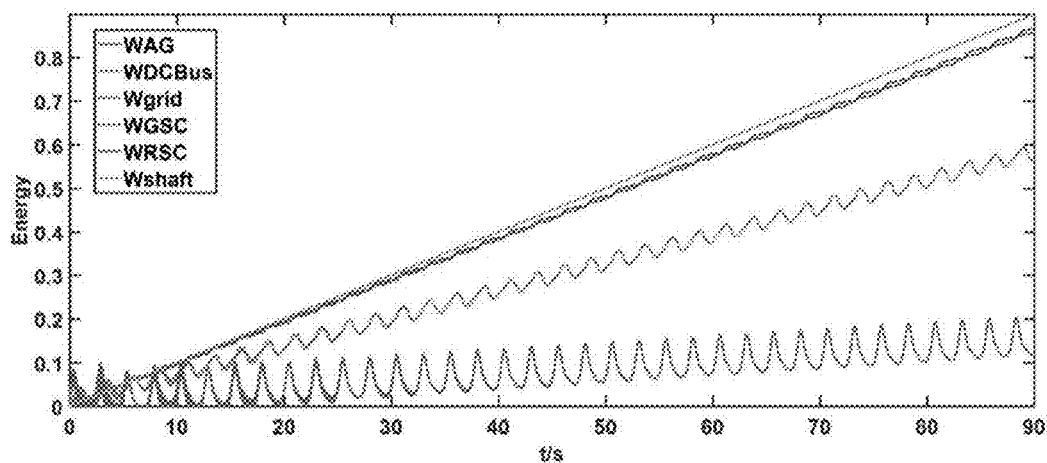
FIG. 7 is a variation diagram of dynamic energy flows of each part in DFIG in case 1 in the third embodiment of the present application.

The variation of the dynamic energy flows of the shaft, the asynchronous generator, the rotor-side converter and its control, the DC bus, the grid-side converter and its control, the power grid and PLL in DFIG in case 1 can be obtained, as shown in FIG. 7. It can be seen from FIG. 7 that the dynamic energy flows of each component of DFIG all exhibit ascending trend in fluctuation in case 1, but their variation patterns are different.

Figure 8:
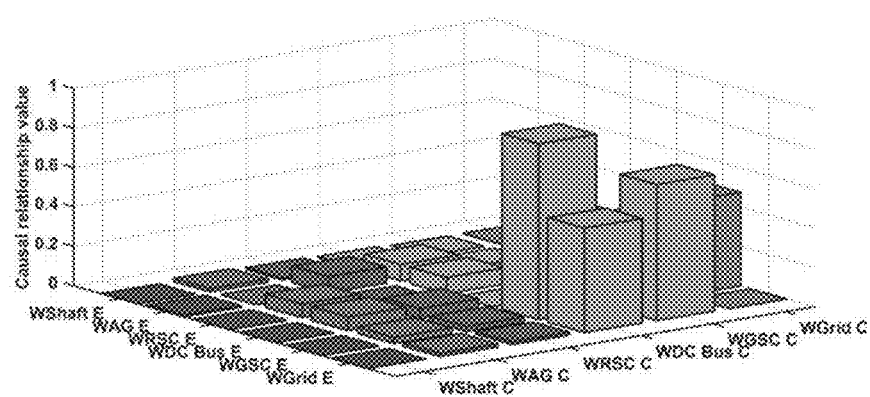
FIG. 8 is a histogram of magnitudes of the causality of the dynamic energy flows in DFIG in case 1 in the third embodiment of the present application.

According to step S3 of the method of locating equipment-level oscillation sources in the first embodiment, the matrix of magnitudes of the causality between the dynamic energy flows of components of the DFIG can be obtained, as shown in Table I. In Table I, the dynamic energy flow marked 'C' in the lower right corner represents that the dynamic energy flows affects other dynamic energy flows as a 'cause', and the dynamic energy flow marked 'E' in the lower right corner represents that the dynamic energy flows is affected by other dynamic energy flows as a "effect". In Table I, each magnitudes of the causality quantifies the intensity of influence that the 'cause' dynamic energy flows on the 'effect' dynamic energy flow. For instance, when the dynamic energy flow of the DC bus $W_{DC\,Bus\_C}$ is used as the 'cause' and the dynamic energy flow of the grid-side converter $W_{GSC\_E}$ is used as the 'effect', the magnitude of the causality (i.e. the intensity of influence) is 0.892. However, when the dynamic energy flow of the DC bus $W_{DC\,Bus\_E}$ is used as the 'effect' and the dynamic energy flow of the grid-side converter $W_{GSC\_C}$ is used as the 'cause', the magnitude of the causality (i.e. the intensity of influence) becomes 0.363. It can be seen that when the two are used as the "cause" and "result", the resulting magnitude of the causality are inconsistent. Considering that the bigger one of magnitudes of the causality between two dynamic energy flows reflects the main causality of the oscillation transmission, therefore, the transmission direction of the oscillation is from the DC bus to the grid-side converter. Using the results in Table I, the histogram of magnitudes of the causality of each dynamic energy flow in the corresponding DFIG is shown in FIG. 8.

TABLE I

Matrix of magnitudes of the Causality of each Dynamic Energy Flow in DFIG in Case 1

|  | $W_{Shaft\_C}$ | $W_{AG\_C}$ | $W_{RSC\_C}$ | $W_{DC\,Bus\_C}$ | $W_{GSC\_C}$ | $W_{Grid\_C}$ |
|---|---|---|---|---|---|---|
| $W_{Shaft\_E}$ | 0.000 | 0.017 | 0.010 | 0.006 | 0.000 | 0.002 |
| $W_{AG\_E}$ | 0.008 | 0.000 | 0.070 | 0.025 | 0.005 | 0.053 |
| $W_{RSC\_E}$ | 0.000 | 0.069 | 0.000 | 0.083 | 0.034 | 0.005 |
| $W_{DC\,Bus\_E}$ | 0.000 | 0.069 | 0.052 | 0.000 | 0.363 | 0.304 |
| $W_{GSC\_E}$ | 0.000 | 0.031 | 0.026 | 0.892 | 0.000 | 0.477 |
| $W_{Grid\_E}$ | 0.000 | 0.064 | 0.014 | 0.529 | 0.691 | 0.000 |

Figure 9:
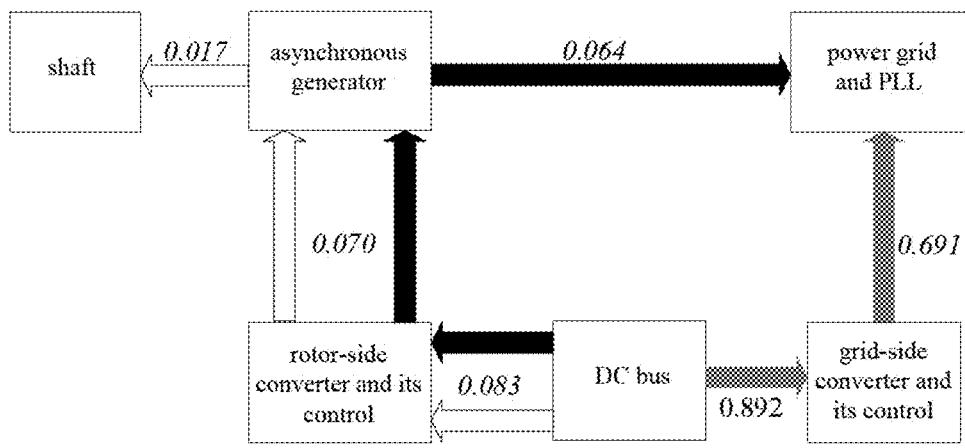
FIG. 9 is a causality diagram of oscillation transmission constructed in case 1 in the third embodiment of the present application.

On the basis, combined with the dynamic energy correlation topology network in FIG. 3, the causality diagram of oscillation transmission can be established as shown in FIG. 9. In FIG. 9, directional lines represent the transmission direction of oscillations. The beginning of the directional line connects the component corresponding to the dynamic energy flow of the 'cause' and the end of the directional line connects the component corresponding to the dynamic energy flow of 'effect'. Different colors are used to distinguish different oscillation transmission routes. According to the size order of the magnitudes of the causality in the diagram, three oscillation transmission routes in DFIG in case 1 can be obtained, where the extremely small causality magnitudes (smaller than $10^{-2}$) are neglected.

Three oscillation transmission routes are: a) route 1 (as indicated by black arrows): the DC bus→the rotor-side converter and its control→the asynchronous generator→the power grid, the magnitudes of the causality between the components are 0.083, 0.070 and 0.064 respectively. b) Route 2 (as indicated by white arrows): the DC bus→the rotor-side converter and its control→the asynchronous generator→the shaft, the magnitudes of the causality between the components are 0.083, 0.070 and 0.017 respectively. c) Route 3 (as indicated by gray arrows): the DC bus→the grid-side converter and its control→the power grid, the magnitudes of the causality between the components are 0.892 and 0.691 respectively. According to the above oscillation transmission routes, it can be determined that the oscillation sources are at the DC bus.

(2) Case 2: adding a continuous sinusoidal periodical power with a frequency of 0.4 Hz to the power of the wind turbine of the DFIG's original system at t=0 s, which will trigger low frequency oscillation in the system.

Figure 10:
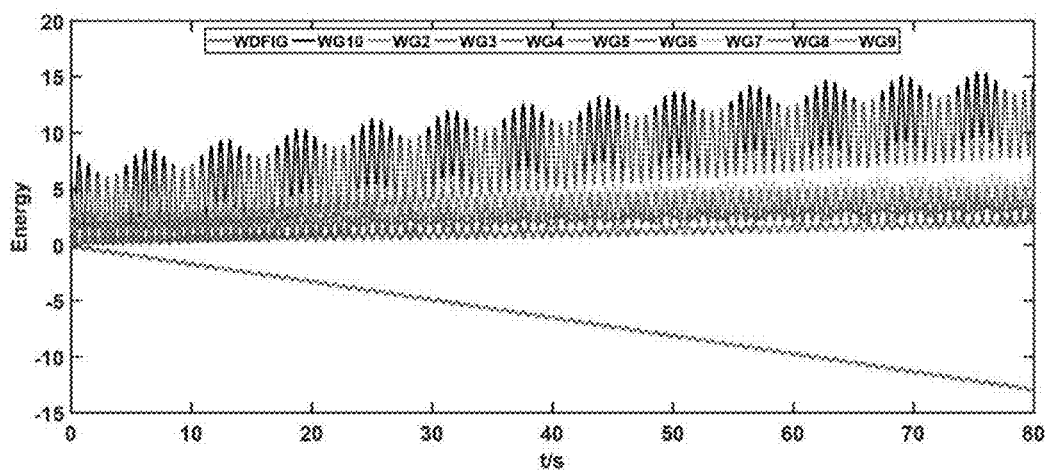
FIG. 10 is a variation diagram of the dynamic energy flows of the system into each generator in case 2 in the third embodiment of the present application.

The variation of the dynamic energy flows injected from the system to each generator can be calculated (the per-unit value is used for each variable involved in the calculation), as shown in FIG. 10. It can be seen from FIG. 10 that the dynamic energy flows injected from the power grid to the DFIG in case 2 are negative, with increasing absolute values, i.e. DFIG keeps injecting the dynamic energy to the power grid. At 80 s, the dynamic energy injected by DFIG reaches 12.5 (p.u.) in case 2, while the other nine generators, i.e. G2, G3, G4, G5, G6, G7, G8, G9 and G10 keep absorbing the dynamic energy from the power grid. According to the above characteristics, it can be identified that the oscillation sources exist in DFIG in case 2.

Figure 11:
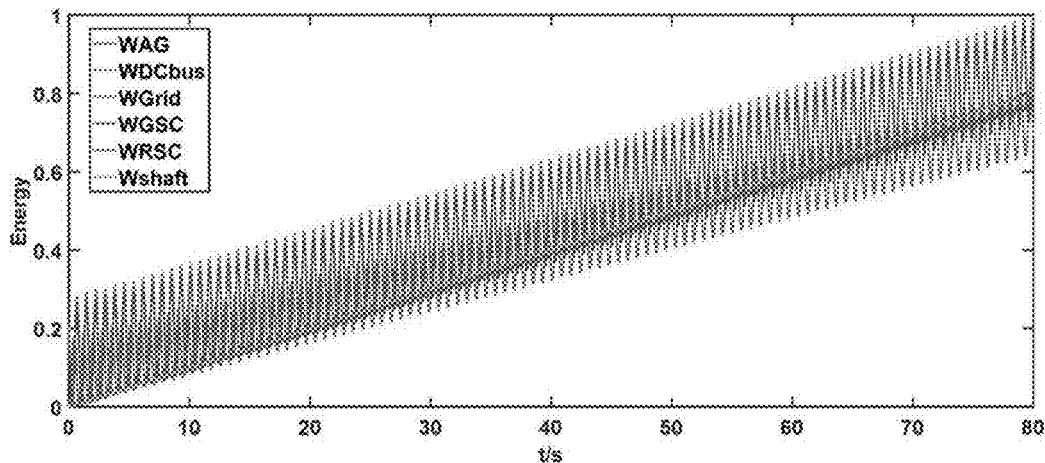
FIG. 11 is a variation diagram of dynamic energy flows of each part in DFIG in case 2 in the third embodiment of the present application.

The variation of the dynamic energy flows of the shaft, the asynchronous generator, the rotor-side converter and its control, the DC bus, the grid-side converter and its control, the power grid and PLL in the DFIG in case 2 can be obtained, as shown in FIG. 11. It can be seen from FIG. 11 that, case 2 is similar to case 1, the dynamic energy flows of each component of the DFIG all exhibit ascending trend in fluctuation in case 2, and variation patterns are different.

Figure 12:
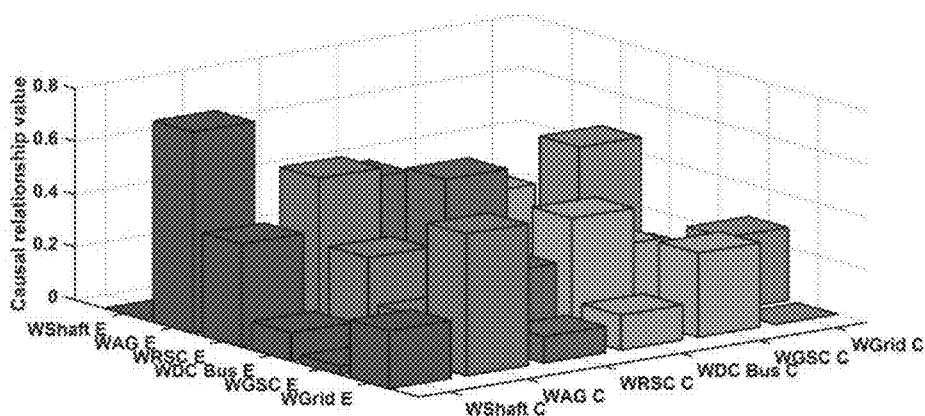
FIG. 12 is a histogram of magnitudes of the causality of dynamic energy flows in DFIG in Case 2 in the third embodiment of the present application.

According to step S3 of the method of locating equipment-level oscillation sources in the first embodiment, the matrix of magnitudes of the causality between the dynamic energy flows of the components of the DFIG in case 2 can be obtained, as shown in Table II. According to Table II, the histogram of magnitudes of the causality of the dynamic energy flows in the corresponding DFIG is shown in FIG. 12.

TABLE II

Matrix of magnitudes of the Causality of each Dynamic Energy Flow in DFIG in Case 2

|  | $W_{Shaft\_C}$ | $W_{AG\_C}$ | $W_{RSC\_C}$ | $W_{DC\ Bus\_C}$ | $W_{GSC\_C}$ | $W_{Grid\_C}$ |
|---|---|---|---|---|---|---|
| $W_{Shaft\_E}$ | 0.000 | 0.011 | 0.003 | 0.000 | 0.000 | 0.000 |
| $W_{AG\_E}$ | 0.761 | 0.000 | 0.477 | 0.346 | 0.011 | 0.461 |
| $W_{RSC\_E}$ | 0.389 | 0.590 | 0.000 | 0.433 | 0.004 | 0.107 |
| $W_{DC\ Bus\_E}$ | 0.106 | 0.341 | 0.581 | 0.000 | 0.231 | 0.085 |
| $W_{GSC\_E}$ | 0.032 | 0.172 | 0.285 | 0.447 | 0.000 | 0.276 |
| $W_{Grid\_E}$ | 0.218 | 0.536 | 0.099 | 0.132 | 0.318 | 0.000 |

Figure 13:
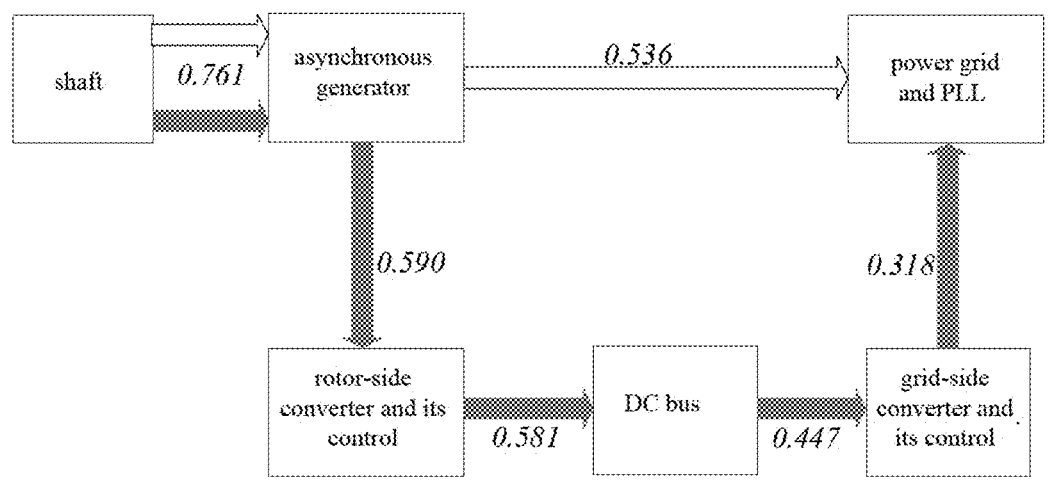
FIG. 13 is a causality diagram of oscillation transmission constructed in case 2 in the third embodiment of the present application.

On the basis, combined with the dynamic energy correlation topology network in FIG. 3, the causality diagram of oscillation transmission in case 2 can be established as shown in FIG. 13. According to the size order of the magnitudes of the causality in the diagram, two oscillation transmission routes in the DFIG in case 2 can be obtained.

Two oscillation transmission routes are: a) route 1 (as indicated by gray arrows): the shaft→the asynchronous generator→the rotor-side converter and its control→the DC bus→the grid-side converter and its control→the power grid, the magnitudes of the causality between components are 0.761, 0.590, 0.581, 0.447 and 0.318 respectively. b) Route 2 (as indicated by white arrows): the shaft→the asynchronous generator→the power grid, the magnitudes of the causality between components are 0.761 and 0.536 respectively. According to the above oscillation transmission routes, it can be determined that the oscillation sources are at the shaft.

(3) Case 3: Three phase short circuit fault occurs at Bus 3 in system at t=90 s (and is cleared after 200 ms), which results in low frequency oscillation in the system.

Figure 14:
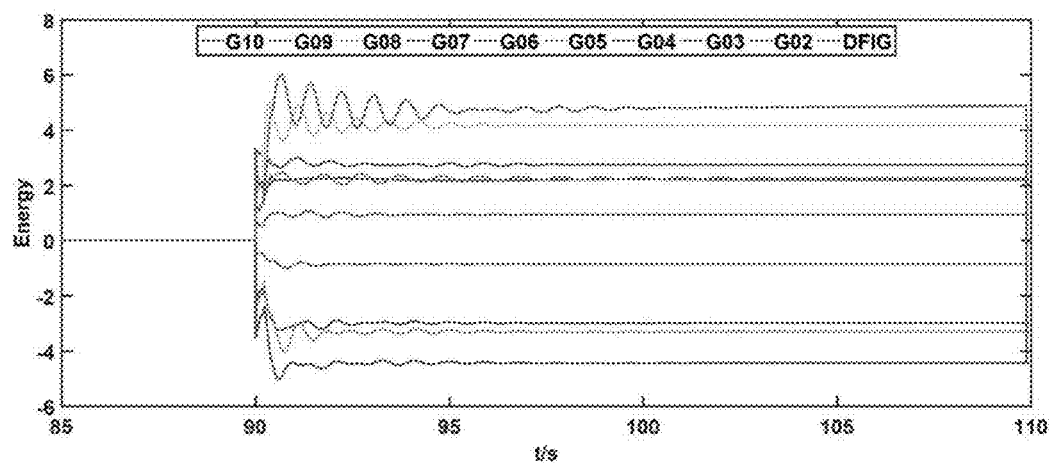
FIG. 14 is a variation diagram of the dynamic energy flows of the system into each generator in case 3 in the third embodiment of the present application.

The variation of the dynamic energy flows injected from the system to each generator can be calculated (the per-unit value is used for each variable involved in the calculation), as shown in FIG. 14. It can be seen from FIG. 14 that, in case 3, the DFIG and other synchronous generators (G2, G3, G8, G9 and G10) absorb the dynamic energy from the system after fault occurs, while G4, G5, G6 and G7 inject the dynamic energy to the system, and the dynamic energy flows of these generators all turn stable after the fault is cleared. Based on the above characteristics, G4, G5, G6 and G7 are identified as oscillation sources, and DFIG and other synchronous generators are not oscillation sources.

Figure 15:
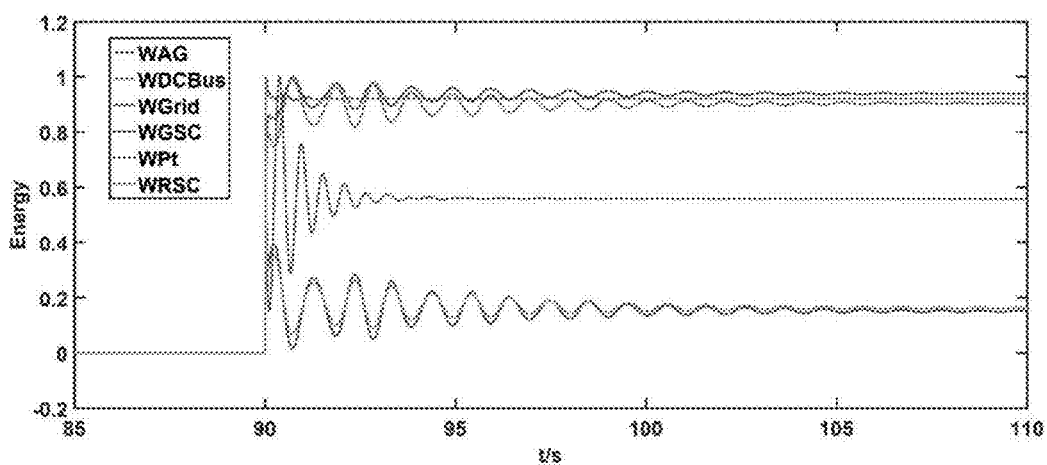
FIG. 15 is a variation diagram of the dynamic energy flows of each part in DFIG in case 3 in the third embodiment of the present application.

The variation of the dynamic energy flows of the shaft, the asynchronous generator, the rotor-side converter and its control, the DC bus, the grid-side converter and its control, the power grid and PLL in the DFIG in case 3 can be obtained, as shown in FIG. 15. It can be seen from FIG. 15 that the variation patterns of the dynamic energy flows of components in the DFIG are still different, after fault occurs, the dynamic energy flows of each component increase sharply first, and then gradually turn stable in different converging speeds after the fault is cleared, wherein the converging speeds of the dynamic energy of the shaft and the DC bus are much faster than those of the other components.

Figure 16:
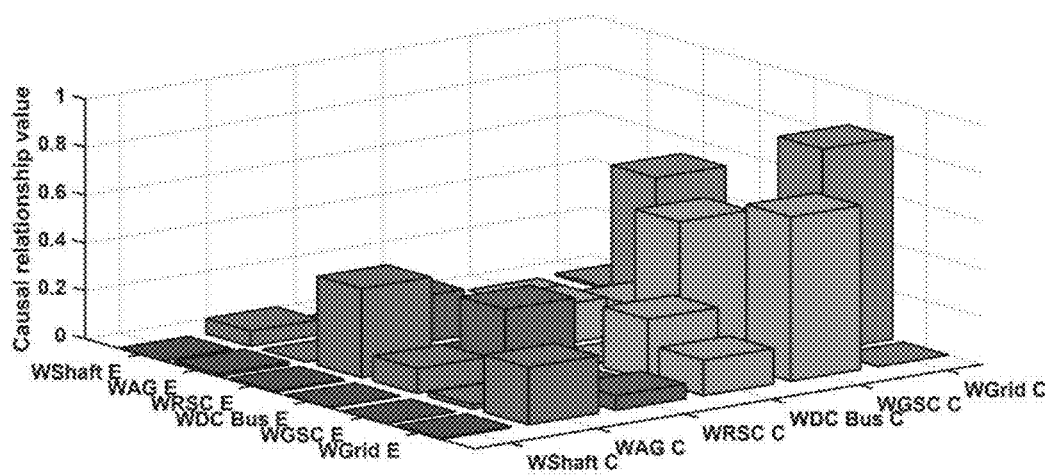
FIG. 16 is a histogram of magnitudes of the causality of dynamic energy flows in DFIG in case 3 in the third embodiment of the present application.

According to step S3 of the method of locating equipment-level oscillation sources in the first embodiment, the matrix of magnitudes of causality between the dynamic energy flows of the components of the DFIG in case 3 can be obtained, as shown in Table III. According to the Table III, the histogram of magnitudes of the causality of each dynamic energy flow in the corresponding DFIG is shown in FIG. 16.

TABLE III

Matrix of magnitudes of Causality of each Dynamic Energy Flow in DFIG in Case 3

|  | $W_{Shaft\_C}$ | $W_{AG\_C}$ | $W_{RSC\_C}$ | $W_{DC\,Bus\_C}$ | $W_{GSC\_C}$ | $W_{Grid\_C}$ |
|---|---|---|---|---|---|---|
| $W_{Shaft\_E}$ | 0.000 | 0.063 | 0.004 | 0.001 | 0.000 | 0.010 |
| $W_{AG\_E}$ | 0.012 | 0.000 | 0.193 | 0.049 | 0.008 | 0.527 |
| $W_{RSC\_E}$ | 0.006 | 0.371 | 0.000 | 0.164 | 0.129 | 0.063 |
| $W_{DC\,Bus\_E}$ | 0.002 | 0.103 | 0.289 | 0.000 | 0.535 | 0.196 |
| $W_{GSC\_E}$ | 0.000 | 0.018 | 0.015 | 0.253 | 0.000 | 0.843 |
| $W_{Grid\_E}$ | 0.005 | 0.239 | 0.061 | 0.148 | 0.686 | 0.000 |

Figure 17:
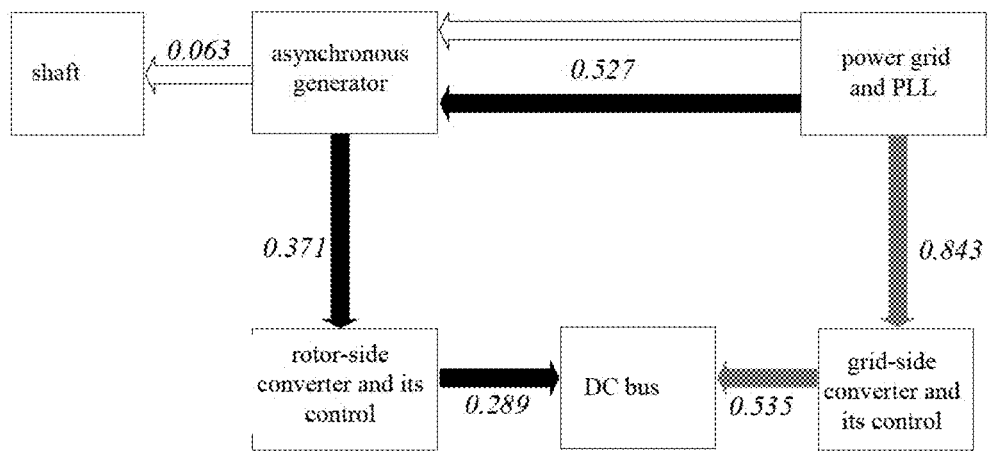
FIG. 17 is a causality diagram of oscillation transmission constructed in case 3 in the third embodiment of the present application.

On the basis, combined with the dynamic energy correlation topology network in FIG. 3, the causality diagram of oscillation transmission can be established, as shown in FIG. 17. According to the size order of the magnitudes of the causality in the diagram, three oscillation transmission routes in the DFIG in case 3 can be obtained.

Three oscillation transmission routes in case 3 are: a) route 1 (as indicated by gray arrows): the power grid→the grid-side converter and its control→the DC bus, the magnitudes of the causality between these components are 0.843 and 0.535 respectively. b) Route 2 (as indicated by black arrows): the power grid→the asynchronous generator→the rotor-side converter and its control→the DC bus, the magnitudes of the causality between these components are 0.527, 0.371 and 0.289 respectively. c) Route 3 (as indicated by in white arrows): the power grid→the asynchronous generator→the shaft, the magnitudes of the causality between these components are 0.527 and 0.063 respectively. According to the above oscillation transmission routes, it can be determined that the oscillation sources are in the power grid which is outside the DFIG.

The calculation results of case 1 and case 2 are both consistent with the simulation setting, which verifies that the proposed method can describe the dynamic energy propagation evolution routes while accurately locating the oscillation sources inside the generator, and can characterize the intensity of mutual influence between the dynamic energy flows of components of DFIG, which will facilitate future research on inside-generator oscillation mechanism of low frequency oscillation in power system with the DFIG integration system. In case 3, when the oscillation sources are not inside the DFIG, the proposed method can still clearly depict the oscillation transmission routes in the DFIG, and quantify the intensity of mutual influence between the dynamic energy flows of the components of the DFIG.

The application proposes a non-transitory machine-readable storage medium comprising instructions that when executed cause a processor of a computing device to: construct energy correlation topology network of components in DFIG; analyze dynamic energy flows between the components during oscillation process; and calculate magnitudes of causality between the dynamic energy flows; building a causality diagram of oscillation transmission in the DFIG; analyzing distribution of the magnitude of the causality in the diagram, determining oscillation transmission routes and locating the oscillation sources.

In conclusion, the device and method for locating equipment-level oscillation sources of DFIG grid-connected system based on the dynamic energy flow constructed by the present application can quantitatively describe the intensity of interaction between the dynamic energy flows of the DFIG internal components and accurately identify the equipment-level oscillation sources and the oscillation transmission routes.

The above are only preferred specific embodiments of the present application, but the scope of protection of the present application is not limited to this, any person skilled in the art can easily think of changes or replacement changes within the technical scope disclosed by the present application should be covered within the protection scope of the present application.

The foregoing descriptions of specific exemplary embodiments of the present application have been presented for purposes of illustration and description. They are not intended to be exhaustive or to limit the application to the precise forms disclosed, and obviously many modifications and variations are possible in light of the above teachings. The exemplary embodiments were chosen and described in order to explain certain principles of the application and their practical application, to thereby enable others skilled in the art to make and utilize various exemplary embodiments of the present application, as well as various alternatives and modifications thereof. It is intended that the scope of the application be defined by the Claims appended hereto and their equivalents.

What is claimed is:

1. A method for locating equipment-level oscillation sources of DFIG grid-connected system to achieve stable operation of the wind power grid-connected system comprising:
    step S1: constructing energy correlation topology network of components in DFIG, wherein the components in the DFIG include: shaft, asynchronous generator, rotor-side converter and its control, DC bus, grid-side converter and its control, power grid and PLL;
    step S2: analyzing dynamic energy flows between the components during oscillation process, wherein the dynamic energy flows between the components in the energy correlation topology network comprise: the dynamic energy flow output by the shaft part, the dynamic energy flow output by the DC bus part, the dynamic energy flow output by the grid-side converter and its control part, the dynamic energy flow output by the rotor-side converter and its control part, the dynamic energy flow output by the asynchronous generator and the dynamic energy flow injected into the DFIG by the power grid and the PLL; and step S3: calculating magnitudes of causality between the dynamic energy flows; building a causality diagram of oscillation transmission in the DFIG; analyzing distribution of the magnitude of the causality in the diagram, determining oscillation transmission routes and locating the oscillation sources, wherein the step S3 comprises:

step S301: normalizing the dynamic energy flows;

step S302: through vector autoregressive model, performing partial directional coherence analysis on the normalized dynamic energy flows, obtaining a matrix of magnitudes of the causality between the dynamic energy flows;

step S303: combining the magnitude of the causality with dynamic energy correlation topology network of wind turbine, building the causality diagram of oscillation transmission; and step S304: depicting the oscillation transmission routes in the causality diagram of oscillation transmission according to size order of the magnitudes of the causality in the diagram, and locating the equipment-level oscillation sources according to the determined oscillation transmission routes.

2. The method for locating equipment-level oscillation sources according to claim 1, the vector autoregressive model is $$\begin{bmatrix} x_1(t) \\ \vdots \\ x_m(t) \end{bmatrix} = \sum_{r=1}^{p} A_r \begin{bmatrix} x_1(t-r) \\ \vdots \\ x_m(t-r) \end{bmatrix} + \begin{bmatrix} u_1(t) \\ \vdots \\ u_m(t) \end{bmatrix};$$

where $(x_1(t), \ldots, x_m(t))^T$ is the dynamic energy flows between m components at t; $(x_1(t-r), \ldots, x_m(t-r))^T$ is the dynamic energy flows between m components at t-r; r∈1, 2, . . . , p, p is the order of the second sub-processor; $(u_1(t), \ldots, u_m(t))^T$ is the an error vector uncorrelated with the dynamic energy flows at t; $A_r$ is the matrix of magnitudes of the causality to be estimated, with its element $A_r(ij)$, i,j=1, 2, . . . , m, characterizing the effect of the value $x_j(t-r)$ of the dynamic energy $x_j$ of the j-th component at t−r on the value $x_i(t)$ of the dynamic energy $x_i$ of the i-th component at t, i.e. the magnitude of the causality between the j-th component and the i-th component.

3. The method for locating equipment-level oscillation sources according to claim 1, wherein during the oscillation, the dynamic energy flows $W_i$ between the components in DFIG meet the following formula: $W_i = \int (P_i d\theta_i + Q_i d(\ln U_i))$; where $P_i$ and $Q_i$ respectively are active power and reactive power of the branch to which the i-th component in the DFIG belongs; $U_i$ and $\theta_i$ respectively are amplitude and phase angle of voltage of the i-th component in the DFIG.

4. The method for locating equipment-level oscillation sources according to claim 1, wherein during the oscillation, the dynamic energy flow output by the shaft part is $W_{shaft} = \int P_t dt$; where $P_t$ is power of wind generator;

the dynamic energy flow of the DC bus part of the DFIG is $W_{DC\ Bus} = \int (Cu_{dc}) du_{dc}$; where C is capacitance of the DC bus; $u_{dc}$ is voltage of the DC bus;

the dynamic energy flow of the grid-side converter and its control part is $$W_{GSC} = \int P_g d\theta_i + \int \frac{Q_g}{U_i} dU_i;$$

where $P_g$ and $Q_g$ are respectively active power and reactive power output by the grid-side converter; $\theta_i$, $U_i$ are respectively phase angle and amplitude of grid-side converter voltage $u_i$;

the dynamic energy flow of the rotor-side converter and its control part is $$W_{RSC} = \int P_r d\theta_r + \int \frac{Q_r}{U_r} dU_r;$$

where $P_r$ and $Q_r$ are respectively active power and reactive power output by the rotor-side converter; $\theta_r$ and $U_r$ are respectively phase angle and amplitude of rotor voltage $u_r$;

the dynamic energy flow of the asynchronous generator in the DFIG is $$W_{AG} = \int P_s d\theta_s + \int \frac{Q_s}{U_s} dU_s;$$

where $P_s$ and $Q_s$ are respectively active power and reactive power output by stator side; $\theta_s$ and $U_s$ are respectively phase angle and amplitude of asynchronous generator voltage $u_s$; and the dynamic energy flow injected into the DFIG by the power grid and the PLL is $$W_{grid} = \int P d\theta_g + \int \frac{Q}{U_g} dU_g;$$

where P and Q are respectively active power and reactive power of power grid; $\theta_g$ and $U_g$ are respectively phase angle and amplitude of power grid voltage $u_g$.

5. A device for locating equipment-level oscillation sources of doubly-fed induction generator grid-connected system to achieve stable operation of the wind power grid-connected system, comprising a data collecting module, a DFIG dynamic energy flows analyzing module, and an equipment-level oscillation sources locating module;

wherein the data collecting module collects parameters, operation data of components in DFIG of wind power grid-connected system and operation data of each node of system, and sends the collected data to the DFIG dynamic energy flows analyzing module and the equipment-level oscillation sources locating module;

wherein the components in the DFIG include: shaft, asynchronous generator, rotor-side converter and its control, DC bus, grid-side converter and its control, power grid and PLL;

the DFIG dynamic energy flows analyzing module constructs energy correlation topology network of the components in the DFIG, and analyzes dynamic energy flows between the components during the oscillation process, wherein the dynamic energy flows between the components comprise: the dynamic energy flow output by shaft part, the dynamic energy flow output by DC bus part, the dynamic energy flow output by grid-side converter and its control part, the dynamic energy flow output by rotor-side converter and its control part, the dynamic energy flow output by asynchronous generator and the dynamic energy flow injected into the DFIG by power grid and PLL, wherein during the oscillation; and the equipment-level oscillation sources locating module calculates magnitudes of causality between the dynamic energy flows, and builds a causality diagram of oscillation transmission in the DFIG, and analyzes distribution of the magnitude of the causality in the diagram, and determines oscillation transmission routes and to locate the oscillation sources, wherein the equipment-level oscillation sources locating module comprises a normalization module, a vector autoregressive model, a causality diagram construction module and an oscillation sources localization module;

the normalization module normalizes the dynamic energy flows;

the vector autoregressive model performs partial directional coherence analysis on the normalized dynamic energy flows and obtains a matrix of magnitudes of the causality between the dynamic energy flows;

the causality diagram construction module combines the matrix of magnitudes of the causality with dynamic energy correlation topology network of wind turbine and builds the causality diagram of oscillation transmission; and the oscillation sources localization module depicts the oscillation transmission routes in the causality diagram of oscillation transmission according to size order of the magnitudes of the causality in the diagram, and locates the equipment-level oscillation sources according to the determined oscillation transmission routes.

6. The device for locating equipment-level oscillation sources according to claim 5, the vector autoregressive model is $$\begin{bmatrix} x_1(t) \\ \vdots \\ x_m(t) \end{bmatrix} = \sum_{r=1}^{p} A_r \begin{bmatrix} x_1(t-r) \\ \vdots \\ x_m(t-r) \end{bmatrix} + \begin{bmatrix} u_1(t) \\ \vdots \\ u_m(t) \end{bmatrix};$$

where $(x_1(t), \ldots, x_m(t))^T$ is the dynamic energy flows between m components at t; $(x_1(t-r), \ldots, x_m(t-r))^T$ is the dynamic energy flows between m components at t−r; r∈1, 2, . . . , p, p is the order of the vector autoregressive model; $(u_1(t), \ldots, u_m(t))^T$ is the an error vector uncorrelated with the dynamic energy flows at t; $A_r$ is the matrix of magnitudes of the causality to be estimated, with its element $A_r(ij)$, i,j=1, 2, . . . , m, characterizing the effect of the value $x_j(t-r)$ of the dynamic energy $x_j$ of the j-th component at t−r on the value $x_i(t)$ of the dynamic energy $x_i$ of the i-th component at t.

7. A non-transitory machine-readable storage medium comprising instructions that when executed cause a processor of a computing device to:

construct energy correlation topology network of components in DFIG, wherein the components in the DFIG include: shaft, asynchronous generator, rotor-side converter and its control, DC bus, grid-side converter and its control, power grid and PLL;

analyze dynamic energy flows between the components during oscillation process, wherein the dynamic energy flows between the components in the energy correlation topology network comprise: the dynamic energy flow output by the shaft part, the dynamic energy flow output by the DC bus part, the dynamic energy flow output by the grid-side converter and its control part, the dynamic energy flow output by the rotor-side converter and its control part, the dynamic energy flow output by the asynchronous generator and the dynamic energy flow injected into the DFIG by the power grid and the PLL; and calculate magnitudes of causality between the dynamic energy flows; building a causality diagram of oscillation transmission in the DFIG; analyzing distribution of the magnitude of the causality in the diagram, determining oscillation transmission routes and locating the oscillation sources, wherein normalizing the dynamic energy flows;

through vector autoregressive model, performing partial directional coherence analysis on the normalized dynamic energy flows, obtaining a matrix of magnitudes of the causality between the dynamic energy flows;

combining the magnitude of the causality with dynamic energy correlation topology network of wind turbine, building the causality diagram of oscillation transmission; and depicting the oscillation transmission routes in the causality diagram of oscillation transmission according to size order of the magnitudes of the causality in the diagram, and locating the equipment-level oscillation sources according to the determined oscillation transmission routes.

* * * * *